United States Patent [19]

Hasenzahl

[11] Patent Number: 4,837,503
[45] Date of Patent: Jun. 6, 1989

[54] REMOTE MEASUREMENT OF HIGH VOLTAGE AC WITH RADAR

[76] Inventor: Ernest L. Hasenzahl, 6609 Lochinvar Dr., Baltimore, Md. 21228

[21] Appl. No.: 134,086

[22] Filed: Dec. 17, 1987

Related U.S. Application Data

[63] Continuation of Ser. No. 765,460, Aug. 14, 1985, abandoned.

[51] Int. Cl.$^4$ .............................................. G01R 19/00
[52] U.S. Cl. ..................................... 324/95; 324/77 A
[58] Field of Search ................... 324/95, 77 A, 76, 96; 342/5, 22

[56] References Cited

U.S. PATENT DOCUMENTS

4,135,152  1/1979  Stuchly et al. ........................ 324/95

OTHER PUBLICATIONS

Lange, W. J.; "Microwave Measurement . . . "; The Journal of Vacuum Science and Technology; vol. 7; No. 1; Jan.-Feb. 1970; pp. 228-232.

*Primary Examiner*—Ernest F. Karlsen
*Attorney, Agent, or Firm*—Walter G. Finch

[57] ABSTRACT

The invention concerns an apparatus and technique for detecting the voltage of A.C. high voltage lines. A radar wave is transmitted towards the high voltage lines and is reflected to a detector when the AC voltage drops to threshold level. Reflection continues until the AC voltage cycles to the threshold level on it second half of the cycle. A time interval is calculated for radar reflection and non-reflection, and a ratio thereof is calculated by a microprocessor which generates a display indicating the voltage carried by the AC lines in accordance with the time interval ratio.

17 Claims, 4 Drawing Sheets

REMOTE MEASUREMENT OF HIGH VOLTAGE AC WITH RADAR

This patent application is a continuation of my U.S. patent application Ser. No. 765,460 filed Aug. 14, 1985, now abandoned, for "Remote Measurement of High Voltage AC With Radar".

BACKGROUND OF THE INVENTION

The invention concerns a method and apparatus for measuring high voltages of AC power lines, using a radar transmitter and a receiver to interpret reflected radar waves in a manner which indicates the line to ground voltage. Radar systems have been used in the past to detect, not only moving objects, but to detect the presence of power lines 20 mm in diameter, at a distance of more than 400 meters. Such a system is under development at AEG-Telefunken, which operates at 60 GHz, and is intended to help helicopters avoid collision with power lines as described in Electronics, the Oct. 20, 1982 issue. The AEG-Telefunken system is unable to determine the voltage occurring at any particular power line, but is only used to detect the presence of a power line.

In *Applied Optics*, Vol. 14, No. 11, Nov. 1975, Massey et al., in their article "Electromagnetic Field Components: Their Measurement Using Linear Electro-optic and Magnetic-optic Effects" discuss the application of laser technology to the measurement of alternating electric and magnetic fields. Here, a laser optical link is used between a field sensor and an electronic measuring apparatus, which eliminate high voltage transformer problems. A laser transmits light which is modulated by a sensor and returned to an optical receiver station, where modulation is detected and the final measurement is calculated.

When a wire or line is energized by a high voltage source, the electrons on the surface of the wire constitute the plasma sheath. From the known formulas for calculating the plasma sheath, it is possible to determine the energy, density, frequency and thickness of the sheath. Because of their small mass, electrons are accelerated rapidly by an electric field and they lose little energy in elastic collisions with the molecules of air. This process converts the electrically neutral molecules, of the air, into electrically charged molecules (ions). Such conversion takes place in the ionization zone 10, near the conductor 12, at AC power frequencies, see FIG. 1. in this zone the ionized air is at the same potential as the line voltage. Depending upon the line voltage, the normal dielectric strength of air, 30 kv per centimeter, may be reduced to zero, in the ionized zone 10. The ionized zone will increase in diameter as the line voltage increases. Naturally, as the distance from the wire increases, the strength of the ionized field decreases and the dielectric strength (K) of the air will increase until it reaches its normal value of one. This changing value of the dielectric strength of the air is important in relation to an electromagnetic wave as discussed below.

As shown in FIG. 2, the horizontal axis represents degrees and the vertical axis, feet in the first case. Thus, it is possible to view the electric field as a function of the normal distances (in feet) typically used for clearances between different phase carrying conductors. Naturally, the distance occurs on each side of the wire, but the wave will actually change shape as the voltage increases, indicating that each value for voltage will change the shape of the wave. In the second case the vertical axis represents volts. The four waves represent 34.5, 110, 220 and 500 kv. Again, it is obvious that a change in the wave shape occurs with each voltage change, and the angle of the wave, as it approaches the zero crossing, varies with each voltage. This means the time interval of a threshold, low voltage, (assuming a common frequency of 60 Hz) on each side of the wave zero crossing, will change with the corresponding wave shape. Thus the wave shape is a direct function of the impressed voltage so that it is possible to state, there is a variation of voltage changes with respect to the sine wave or time in the low voltage range, for each of the four waves of FIG. 2, as the zero-crossing is approached.

For the interaction of an electromagnetic wave with a 60 Hz field, a formulation in terms of a physical interpretation of a medium's conductivity is often useful. Specifically, the concern is the effect of an ionized gas on the passage of an electromagnetic wave through it. From the known formula for such a propagation constant, we find the contribution to the dielectric constant of the conductivity of the medium is supplied when the fraction, normal gas divided by the ionized gas, is solved. it becomes clear, that as the electromagnetic wave penetrates the 60 Hz. field the propagation of the wave becomes slower and its energy is lost in the medium.

The interaction with the plasma sheath has two aspects. It can be mathematically derived that, as the electromagnetic wave attempts to penetrate the sheath which is an electrostatic field, the displacement current is 180° out of phase with conduction current, but of equal amplitude. Thus the two cancel, so that no wave can propagate through the plasma. Also, per known formulas, when a certain density, as in the plasma sheath, is reached power can no longer be absorbed. These conditions are voltage dependent. When the instantaneous voltage of an AC power line is high, an electromagnetic wave is prevented from reflecting from the power line.

SUMMARY OF THE INVENTION

The invention concerns a method and apparatus for measuring voltages occurring on high voltage AC lines wherein a radar wave is transmitted toward the power lines, reflected, and interpreted, to indicate the voltage levels.

A 60 Hz signal of varying voltage levels, is typically carried on the high voltage lines within the U.S. No matter what the amplitude of the voltage, the time difference between zero crossings of the associated AC signal is the same, since all such signals are 60 Hz by convention. Since the amplitude of the voltage signal will vary, the change in voltage with respect to the sine wave will also. For higher voltages a greater change in voltage occurs as a zero crossing is approached, while for low voltages a smaller change over the same range of sine waves, and hence, time period occurs. A high voltage prevents reflection of a generated wave as discussed above. Accordingly, a time signal is generated during a first half of the AC cycle when the threshold voltage is achieved (when wave reflection is initially possible) as the zero crossing is approached, and a second time signal is generated upon reaching the threshold during the second half of the AC cycle (wave reflections ceasing). The time interval between these time signals is a direct function of the voltage as it changes with respect to time, such change being mathematically correlated to a specific voltage amplitude. A ratio of wave reflecting time to non-reflecting time is used for correlating the specific voltage amplitudes. Approximately ten to and such measurements are taken in about one second to provide an accurate indication of the voltage level occurring on the AC lines.

DETAILED DESCRIPTION OF THE INVENTION

Figure 1:
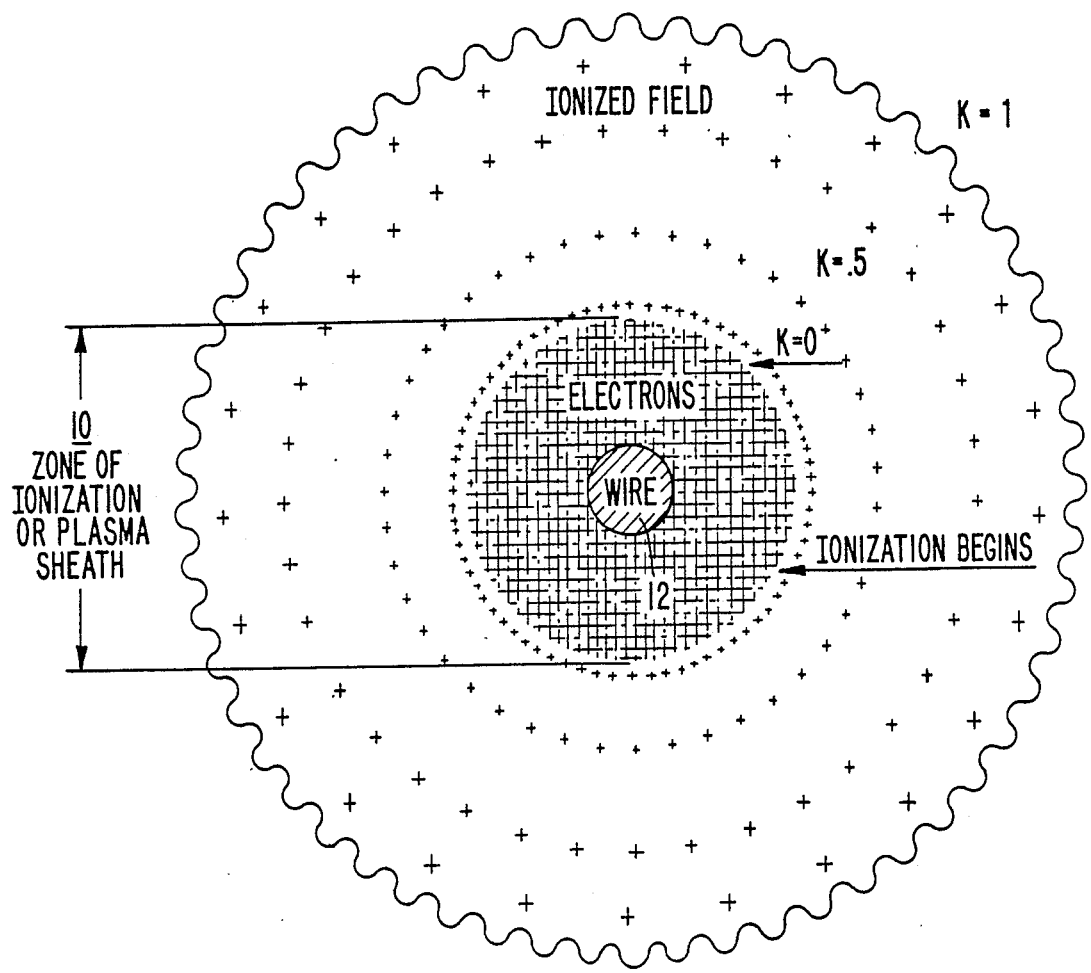
FIG. 1 shows, the ionization sheath which occurs about a conductor, as known in the prior art.
Figure 2:
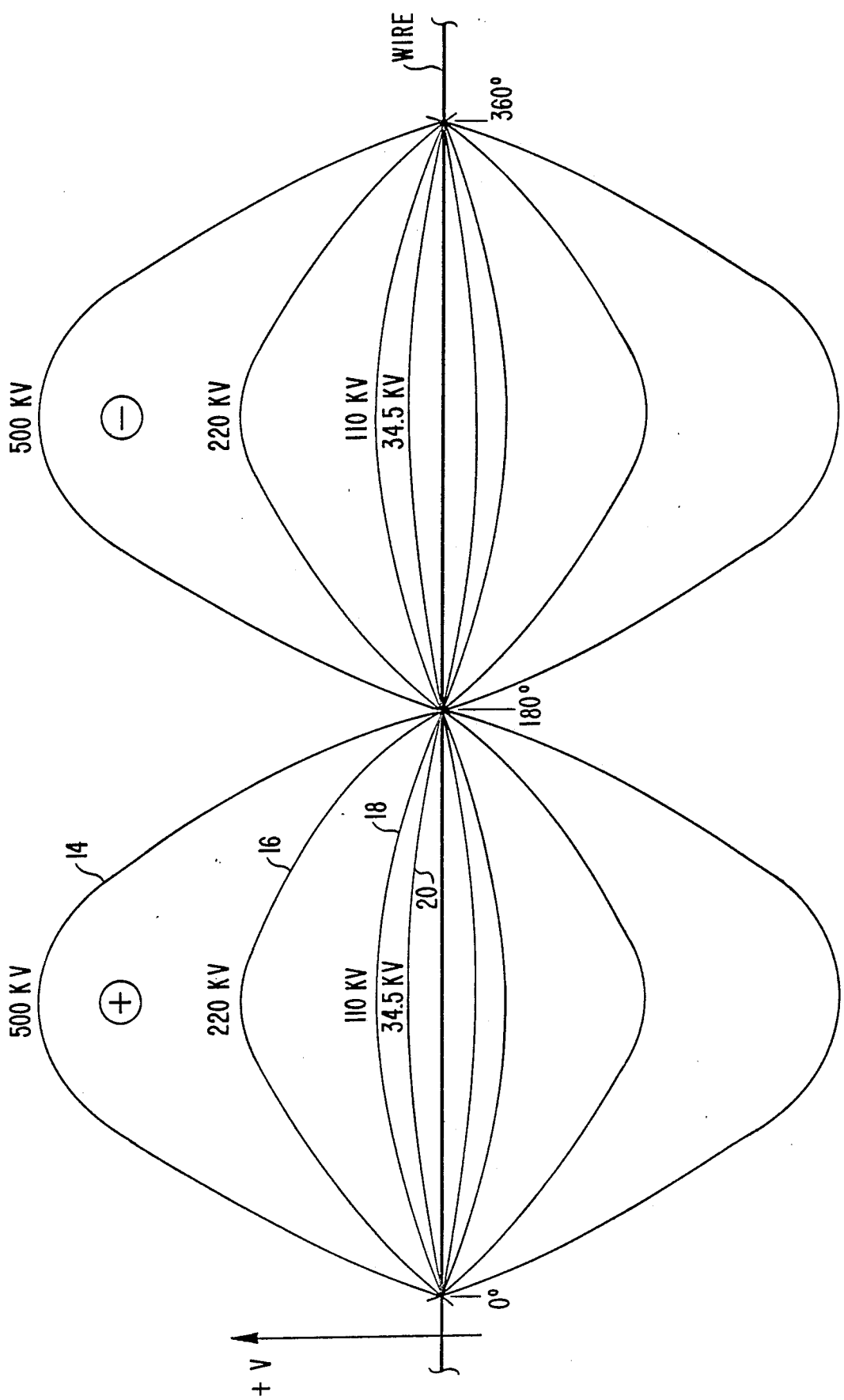
FIG. 2 shows four AC voltage signals of varying amplitude, but at a common frequency.

In FIG. 2 four waves are shown which represent different voltages that may be transmitted over the AC power lines. It is evident by the common zero cross over points (where V=0) that the four signals have a common frequency and are in phase (for illustration of the principals of the present invention). Wave 14 represents the transmission of 500 KV over the power lines, while wave 16 represents 220 KV. Waves 18 and 20, respectively, represent 110 KV and 34.5 KV, also traveling over the high power lines. Due to the differences in amplitude of waves 14, 16, 18 and 20, it is apparent from FIG. 2 that the rate of change of voltage with respect to the sine wave is greatest for wave 14 and smallest for wave 20. This distinction is incorporated into the present invention, as discussed with respect to FIG. 3. The plotted waves 14 through 20 occur on both sides of the high voltage line. However, a radar beam when transmitted towards the wire, will only see one-half of the voltage field. Therefore, the periods of a low voltage will be greater than viewed from a conventional sine wave representation, which does not show voltage on both sides of the conductor, as seen by the radar beam. The use of continuous wave radar is used in the preferred embodiment of the invention, the selected frequency, however, involves other considerations. To determine such a frequency, the size of the object to be detected must be taken into consideration. An assumption was made that for power lines carrying voltages of 34.5 KV or more, the power line would be no less than one-half inch in diameter. Thus, the frequency is calculated to be 24 Ghz in the K band. As discussed with respect to FIG. 1, when the instantaneous voltage of an AC power line is great, a radar signal transmitted thereto is prevented from being reflected. However, when the instantaneous voltage falls below a threshold level, reflection of the radar wave occur. The radar wave continues to be reflected through the position portion of the cycle, into the negative portion, until the AC voltage is again greater than the threshold. Once the voltage increases to this higher threshold level, wave reflection is again prevented. The time interval between the start of radar wave reflection and end of radar wave reflection as compared to its non reflective time interval indicates the voltage of the AC power line.

Figure 3:
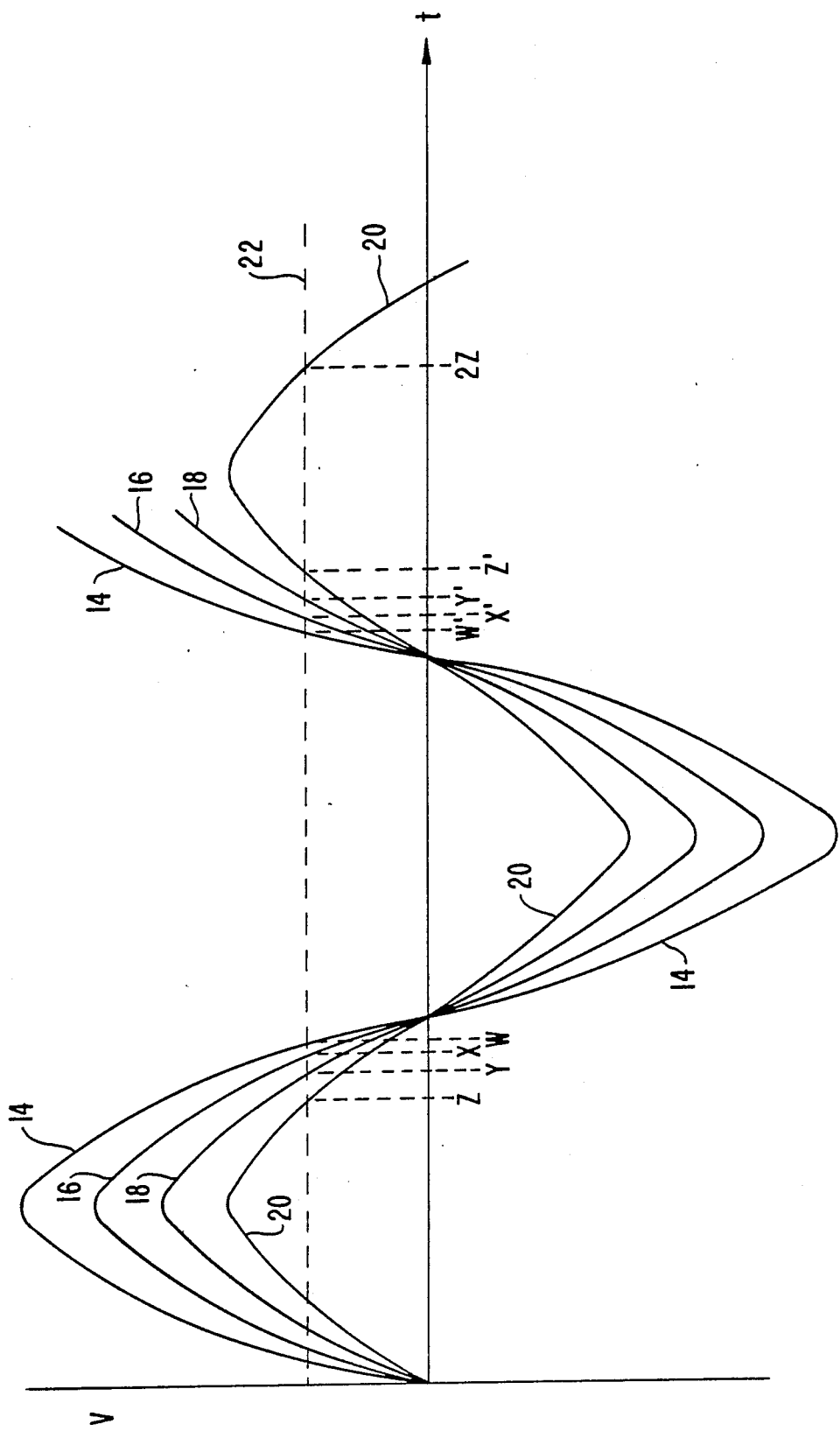
FIG. 3 shows the voltages of FIG. 2 plotted against time.

FIG. 3 shows a portion of the graph portrayed in FIG. 2, but the waves 14–20 are plotted against time instead of the angle of the sine wave. Here, the AC voltage waves 14 through 20 have a zero cross over the same instant. A positive threshold voltage is shown at 22 below which radar reflection occurs. Accordingly, when the 500 KV signal 14 is in its decreasing portion of its positive cycle, threshold voltage 22 reached at time W. Since reflection of a radar wave from the AC power line is possible when the instantaneous voltage is below the threshold voltage 22, it is apparent that such reflection occurs beginning at time W and ending at time W'. Wave 20, which represents 34.5 KV, obviously decreases at a slower rate. During the downward portion of wave 20's positive cycle, threshold voltage 22 is reached at time Z, when radar reflection begins. At time Z' the wave 20 cycles back to the threshold and reflection ceases. Thus, for a 34.5 KV signal a reflection of a radar wave occurs for an interval of time Z'-Z, which is much greater than wave 14's interval of W'—W. As is evident from FIG. 3, a radar wave is reflected for an interval of Y'-Y and an interval of X'-X for voltages occurring per wave 16 and 18, respectively.

Figure 4:
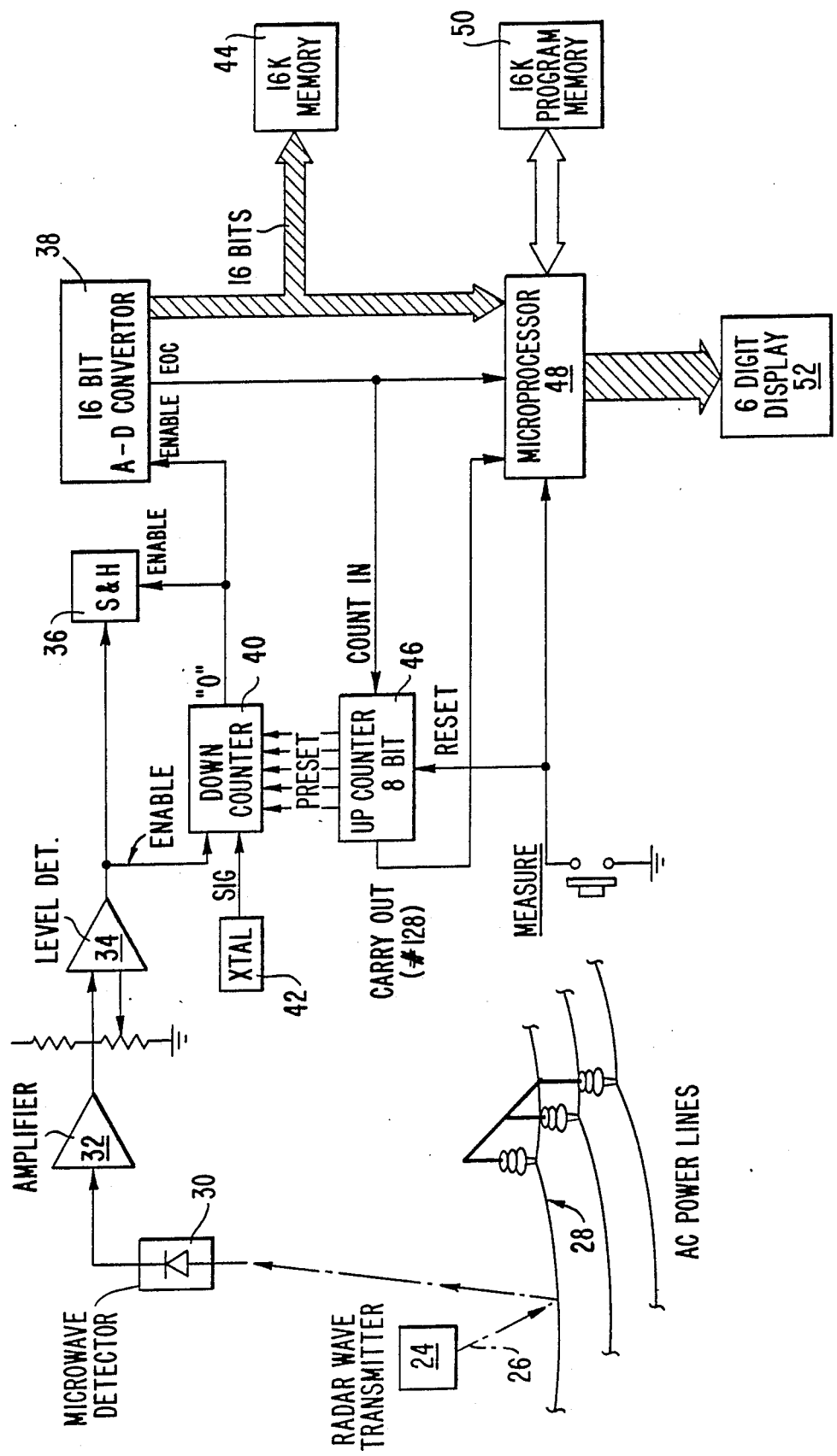
FIG. 4 shows a schematic of the present invention.

FIG. 4 shows an apparatus in accordance with the present invention. A radar wave transmitter 24 generates a radar wave 26 towards AC power lines 28, which when the voltage of the AC power lines 28 is sufficiently low, allows reflection of the radar wave 26 to a microwave detector 30. The microwave detector 30 generates a signal to an amplifier 32, for amplification of the detected signal. When the amplifier output obtains a pre-determined value, level detector 34 enables a sample and hold circuit 36, the output of which is then converted by a 16 bit analog to digital converter 38. The output of the level detector 34 also enables a down counter 40, which is driven by a crystal oscillator 42. The down counter 40 enables the sample and hold circuit 36 and the 16 bit A/D converter 38. A digital representation of the instantaneous value of detected radar wave is stored in a 16K memory 44. The A to D converter 38 also pulses an 8 bit up-counter 46, such that the up-counter simultaneously generates a time signal to a microprocessor 48. The time signal generated by the up-counter is indicative of the beginning of the radar wave reflection interval. Once reflection of the radar wave ceases due to high voltage in the AC power lines, a second time signal is generated in a manner similar to the above, for transmission to the microprocessor. The beginning and ending of times of radar reflection are then used in calculating a time interval of radar transmission and of non-transmission, a ratio of which is then calculated. The microprocessor then uses a "look-up" procedure and accesses a second 16K program memory 50. The time interval ratio is compared within the memory and a corresponding voltage level is displayed on a six digit display 52. As an example, if the radar wave transmitter 24 was used to generate a radar wave towards the AC power lines having a voltage of 34.5 KV, the reflecting time interval would be equal to Z'-Z, while the non-reflective intervals is 2Z-Z. See FIG. 3. The program memory would be accessed to reveal that a ratio of these time intervals corresponds to the 34.5 KV level. The microprocessor would then actuate the display, indicating a digital representation of the 34.5 KV.

The present invention determines the time that the reflected radar signal is a specific percentage of a maximum level to be reflected, thus eliminating distance, wire diameter, and humidity variables. When a strong signal is received it is delivered to the down counter 40 which is reset automatically every 50 milliseconds. The second time interval is compared with the first, and if a match occurs, is stored in an up counter 46. A mismatch causes the first signal to be discarded and the second signal to be used for comparison. In this manner, also false signals are disregarded and only valid indications are processed. If such comparisons agree, then the result is forwarded and displayed on the six digit display.

The tabulation set forth below shows the effect of an increase in the number of pulses per second. The greater the number of pulses, the greater the accuracy.

| Pulses per second | 100 | 1,000 | 10,000 |
|---|---|---|---|
| Pulses per millisecond | .1 | 1 | 10 |
| Pulses per 16 ms, 1 cycle | 1.6 | 16 | 160 |
| Pulses per 50 ms, Reset | 5 | 50 | 500 |
| Number of cycles per Reset | 3.125 | 3.125 | 3.125 |

Other modifications are apparent to those skilled in the art which do not depart from the spirit of the present invention, the scope thereof being defined by the appended claims.

What is claimed is:

1. A system for determining the voltage of the sine wave of an AC power line, including:
   a transmitter means for generating electromagnetic waves beamed to said AC power line;
   receiver means for detecting the reflected electromagnetic waves from said AC power line depending upon the instantaneous value of said AC sine wave, with a change in the shape of said AC sine wave, as the voltage varies, creating a varying time interval during which said electromagnetic waves are reflected from said powerline; and
   a display means for indicating a voltage value as a function of said varying time interval.

2. A system for calculating the voltage of a AC power line as recited in claim 1, wherein said power line carries an AC voltage, with said receiver means including a threshold switching means connected to the output of said receiver means and connected as an input to said display means, with said threshold switching means closing during each half cycle of said AC voltage when said voltage output of said receiver means reaches a threshold voltage level.

3. A system for calculating the voltage of a AC power line as recited in claim 2, including a clocking means connected to said threshold switching means and which is enabled thereby.

4. A system for calculating the voltage of a AC power line as recited in claim 3, including a memory means connected to said clocking means for storing a first value representing the beginning of the time interval.

5. A system for calculating voltage of a AC power line as recited in claim 4, wherein said threshold switching means is connected to open during a second half cycle of the AC voltage such that said memory means also stores a second value representing the end of the time interval.

6. A system for calculating the voltage of a AC power line as recited in claim 5, and additionally a processing means for calculating the time interval between the beginning of the time interval and the end of the time interval, and determining a voltage as a function of said time interval.

7. A system for calculating the voltage of a AC power line as recited in claim 6, and a storage means for storing information which determines the time interval of a particular voltage, said storage means being connected to the display for indicating the determined voltage.

8. A system for calculating the voltage of a AC power line as recited in claim 7, wherein said storage means contains large time intervals corresponding to lower voltages, and small time intervals corresponding to higher voltages.

9. A method of determining the voltage of the sine wave of an AC power line due to the change in the shape of the sine wave as the voltage changes, the steps including:
   transmitting electromagnetic waves beamed to said AC power line;
   detecting said electromagnetic waves upon the instantaneous value of said AC sine wave as the shape of said sine wave varies with said voltage, creating a varying time interval during which said electromagnetic waves are reflected from said power line; and
   calculating and displaying a voltage value as a function of said varying time interval.

10. A method of calculating the voltage of a AC power line as recited in claim 9, including:
    receiving said reflected electromagnetic waves; and
    generating a signal indicating reception of said reflected electromagnetic waves.

11. A method of calculating a voltage of a AC power line as recited in claim 10, including closing a threshold switching means during a first half cycle of the AC voltage when the voltage representing reception of the reflected electromagnetic waves achieves a predetermined threshold level.

12. A method of calculating a voltage of a AC power line as recited in claim 11, including enabling a clock with the threshold switching means.

13. A method of calculating the voltage of a AC power line as recited in claim 12, including, storing a voltage value representing a time interval beginning, in a storage means, when said clock is enabled.

14. A method of calculating a voltage of a AC power line as recited in claim 13, including:
    opening the threshold switching means during a second half cycle of said AC voltage; and
    storing a voltage value representing a time interval end, in said storage means.

15. A method of calculating a voltage of the AC power line as recited in claim 14, including:
    calculating the time interval between the beginning of the time interval and the end of said time interval, and;
    calculating a voltage value as a function of said time interval.

16. A method of calculating a voltage of a AC power line as recited in claim 15, including storing a "look-up" table which correlates a time interval to a particular voltage.

17. A method of calculating a voltage of the AC power line as recited in claim 16, including correlating in said storage means of large voltages to short time intervals, and small voltages to long time intervals.

* * * * *